(12) United States Patent
Dunn et al.

(10) Patent No.: US 6,171,921 B1
(45) Date of Patent: Jan. 9, 2001

(54) METHOD FOR FORMING A THICK-FILM RESISTOR AND THICK-FILM RESISTOR FORMED THEREBY

(75) Inventors: Gregory J. Dunn, Arlington Heights; Steven M. Scheifers, Hoffman Estates, both of IL (US)

(73) Assignee: Motorola, Inc., Schaumburg, IL (US)

( * ) Notice: Under 35 U.S.C. 154(b), the term of this patent shall be extended for 0 days.

(21) Appl. No.: 09/093,007

(22) Filed: Jun. 5, 1998

(51) Int. Cl.$^7$ .............................. B05D 5/12; H01C 17/065
(52) U.S. Cl. ............................................. 438/382; 427/101
(58) Field of Search .................................... 338/309, 307, 338/314, 204, 338, 209, 382; 438/382, 399; 257/516, 520, 538; 427/101, 102, 103

(56) References Cited

U.S. PATENT DOCUMENTS

| | | | |
|---|---|---|---|
| 4,336,320 | * 6/1982 | Cummings et al. | 430/198 |
| 5,466,963 | * 11/1995 | Beasom | 257/516 |
| 5,849,355 | * 12/1998 | McHenry | 427/79 |
| 5,872,038 | * 2/1999 | Duane et al. | 438/279 |
| 5,935,642 | * 8/1999 | Suga | 427/101 |
| 5,960,270 | * 9/1999 | Misra et al. | 438/197 |
| 5,994,997 | * 11/1999 | Brown et al. | 338/309 |

* cited by examiner

Primary Examiner—Mary Wilczewski
Assistant Examiner—David Goodwin
(74) Attorney, Agent, or Firm—Douglas D. Fekete

(57) ABSTRACT

A process for forming a thick-film resistor whose dimensions can be accurately obtained, thereby yielding a precise resistance value. The method includes providing on a substrate a photoimageable layer that preferably forms a permanent dielectric layer of a multilayer structure. An opening is photodefined in the surface of the photoimageable layer, and then overfilled with an electrically-resistive material to form a resistive mass having an excess portion that lies on the surface of the photoimageable layer surrounding the opening. Following curing which causes the surface of the resistive material to become recessed below the surface of the photoimageable layer, the excess portion of the resistive mass is removed, preferably by abrading or a similar operation, such that the lateral dimensions of the resistive mass are determined by the lateral dimensions of the opening in the photoimageable layer. Thereafter, subsequent processing is preformed to include the photoimageable layer as a permanent photoimageable layer of a circuit board, with the resistive mass and appropriate terminations forming a resistor in the permanent photoimageable layer.

13 Claims, 1 Drawing Sheet

METHOD FOR FORMING A THICK-FILM RESISTOR AND THICK-FILM RESISTOR FORMED THEREBY

This invention was made with Government support under Agreement No. F33615-96-2-1838 awarded by DARPA. The Government has certain rights in the invention.

BACKGROUND OF THE INVENTION

The present invention generally relates to printed wire board circuits and their fabrication. More particularly, this invention relates to a method for forming a thick-film resistor to have precise dimensions determined by photolithography techniques, thereby avoiding the variability associated with conventional screen printed resistors.

Thick-film resistors are employed in hybrid electronic circuits to provide a wide range of resistor values. Such resistors are formed by printing, such as screen printing, a thick-film resistive paste or ink on a substrate, which may be a printed wiring board (PWB), flexible circuit, or a ceramic or silicon substrate. Thick-film inks used with ceramic printed wire boards are typically composed of a glass frit composition, an electrically-conductive material, various additives used to favorably affect the final electrical properties of the resistor, and an organic vehicle or polymer matrix material. Thick-film inks used in organic printed wire board construction are typically composed of an electrically-conductive material, various additives used to favorably affect the final electrical properties of the resistor, an organic binder and an organic vehicle. After printing, the thick-film ink is typically heated to dry the ink and convert it into a suitable film that adheres to the substrate. If a polymer thick-film ink is used, the heating step serves to remove the organic vehicle and to cure the polymer matrix material. Other thick-film inks must be sintered, or fired, during which the ink is heated to burn off the organic vehicle and fuse the remaining solid material.

The electrical resistance of a thick-film resistor is dependent on the precision with which the resistor is produced, the stability of the resistor material, and the stability of the resistor terminations. Control of the x, y and z dimensions (the width, electrical length and thickness, respectively, of the resistor) is particularly challenging in view of the techniques employed to print thick-film inks and the dimensional instability that may occur during subsequent processing. For rectangular screen-printed resistors, the x and z dimensions are determined by the screening process, and the y dimension is determined by the termination pattern. Conventional screen printing techniques generally employ a template with apertures bearing the positive image of the resistor to be created. The template, referred to as a screening mask, is placed above and in close proximity to the surface of the substrate on which the resistor is to be formed. The mask is then loaded with the resistive ink, and a squeegee blade is drawn across the surface of the mask to press the ink through the apertures and onto the surface of the substrate.

Compared to many other deposition processes, screen printing is a relatively crude process. As a result, screen printed thick-film resistors are typically limited to dimensions of larger than about one millimeter, with dimensional tolerances generally being larger than about ±10% at this lower limit. Consequently, screen printed thick-film resistors having adequate tolerances in the x and y dimensions are often larger than chip resistors. The thickness of a thickfilm resistor can generally be controlled to tolerances of about 20% to 30% by screen printing, due in large part to variability in the x, y and z dimensions. While the z dimension (thickness) of a screen-printed thick-film resistor can be reasonably well controlled through precision in the screening operation, the control of x and y dimensions is fundamentally limited by the relatively coarse mesh of the screen and by ink flow after deposition. As a result, resistance tolerances of less than ±20% cannot be achieved with screen printed thick-film resistors without laser trimming, an operation that is usually cost prohibitive for complex circuits.

From the above, it can be seen that present practices involving the fabrication of thick-film resistors can necessitate a compromise between the precision of the resistance value and the size of the resistor. In other words, while smaller resistors are often preferred to yield a more compact circuit, an undesirable consequence is that resistance values are less predictable due to the dimensional variability of the resistors. Accordingly, a need exists for a method for producing a thick-film resistor in which resistance values and tolerances can be more accurately controlled than prior art screen printing techniques permit.

SUMMARY OF THE INVENTION

According to the present invention, a process is provided for forming a resistor whose x (width), y (electrical length) and z (thickness) dimensions can be accurately obtained, thereby yielding a resistor whose resistance value can be precisely obtained even for resistors having dimensions on the order of about 100 micrometers. The resistor can be formed with conventional thick-film resistor inks used to form screen printed thick-film resistors, although the precision of the final dimensions of resistors formed in accordance with this invention is better than that possible for prior-art screen printed thick-film resistors.

The method of this invention preferably entails the use of one or more photoimageable resins as masks that may subsequently form permanent dielectric layers of a multi-layer structure. The method includes providing a dielectric layer on a substrate, and then defining an opening in the surface of the dielectric layer. In the preferred embodiment where the dielectric layer is formed with a photoimageable resin, the opening is photodefined to precisely achieve the dimensions for the intended thick-film resistor. The opening is then filled with an electrically-resistive material, preferably using a screen printing technique with an oversized aperture such that the electrically-resistive material forms a resistive mass having an excess portion that lies on the surface of the dielectric layer surrounding the opening. The excess portion of the resistive mass is then selectively removed such that the resistive mass has lateral dimensions defined by the opening in the dielectric layer. Thereafter, subsequent processing is preformed such that the dielectric layer forms a permanent layer of a circuit board, with the resistive mass and appropriate terminations forming a resistor in the permanent dielectric layer.

In the preferred embodiment, the portion of the resistive mass lying on the surface of the dielectric layer is removed by abrading, such as grinding or polishing. For this purpose, the resistive mass is heated to cure the electrically-resistive material prior to the abrading operation, such that shrinkage of the resistive mass occurs and the surface of the resistive mass becomes recessed below the surface of the dielectric layer. During the abrading operation, the excess portion of the resistive mass remaining on the surface of the dielectric layer is removed without substantially altering the recessed surface of the resistive mass and with minimal removal of the dielectric layer.

As is conventional, the tenninations of the thick-film resistor of this invention determine the electrical length of the resistor. The terminations may be in the form of electrical contacts lying either above or below the resistor. To form tenninations that overlie the resistor, the method of this invention further includes the step of forming a second dielectric layer on the dielectric layer and over the resistive mass after the excess portion of the resistive mass has been removed. Openings are formed in this second dielectric layer to expose at least two regions of the resistive mass, and an electrically-conductive material is then deposited in the openings to form electrical contacts that serve as terminations for the resistor. Alternatively, tenninations that lie below the resistor may be formed in or on the substrate underlying the dielectric layer in which the resistor is formed.

From the above, those skilled in the art will appreciate that the method described above is conducive to inline processing, thus enabling high throughput and short cycle times. More significantly, those skilled in the art will appreciate that the method of this invention more precisely produces thick-film resistors than possible with prior art screen printing techniques, because the opening formed in the dielectric layer and the openings for the terminations determine the width and electrical length, respectively, of the thick-film resistor. Meanwhile, the screen printing operation is limited to determining the thickness of the thick-film resistor. According to the invention, dielectric layers formed of photoimageable thick-film polymers are particularly suitable for confining a mass of resistor ink, such as polymer thick-film inks known in the art. The precision with which the openings for the resistor and terminations can be photolithographically defined yields a thick-film resistor whose dimensions can be controlled far better than is possible by conventional screen printing techniques. As a result, thick-film resistors having dimensions on the order of about 100 micrometers with dimensional tolerances of less than about ±5% are possible with this invention. Notably, the method of this invention entails depositing the resistive ink in and around the opening in the dielectric layer, a step that can be readily carried out by screen printing because the screen printing operation does not itself determine the lateral dimensions of the resulting thick-film resistor. In contrast, prior art screen printing methods have relied solely on the dimensions of an aperture in a screening mask to determine and control all dimensions of a thick-film resistor, which has limited prior art screen printed thick-film resistors to dimensions larger than about one millimeter with dimensional tolerances generally larger than about ±10% at the lower size limit.

DETAILED DESCRIPTION OF THE PREFERRED EMBODIMENT

Figure 1:
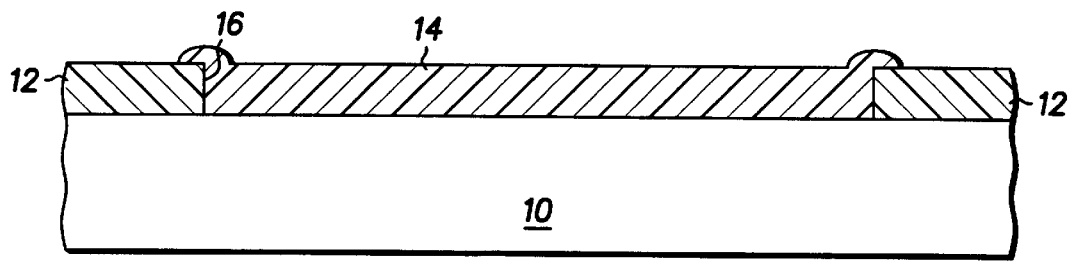
FIG. 1 through FIG. 3 represent processing steps for forming thick-film resistors in accordance with a preferred embodiment of this invention.
Figure 2:
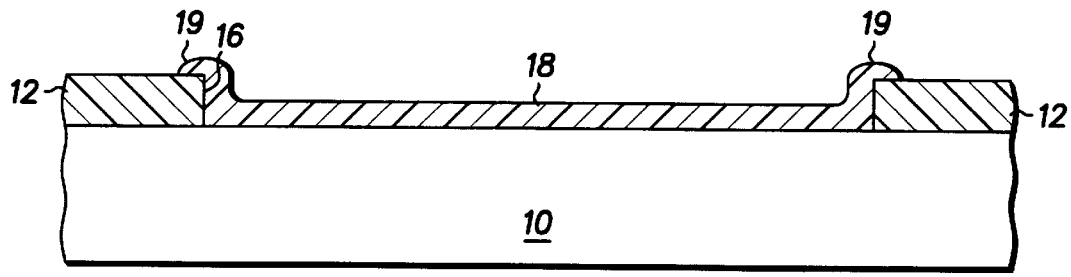
Figure 3:
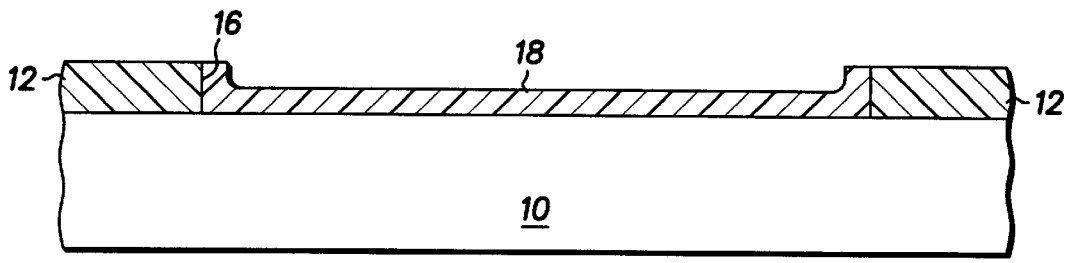
Figure 4:
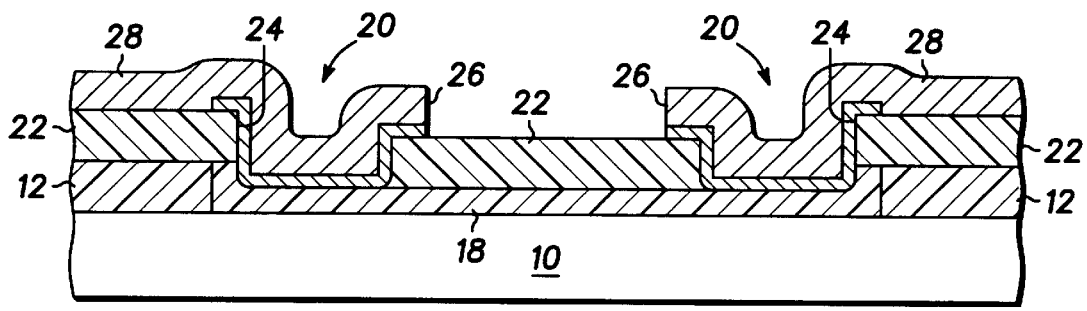
FIG. 4 and FIG. 5 are cross-sectional views of thick-film resistors with alternative terminal configurations in accordance with the invention.
Figure 5:
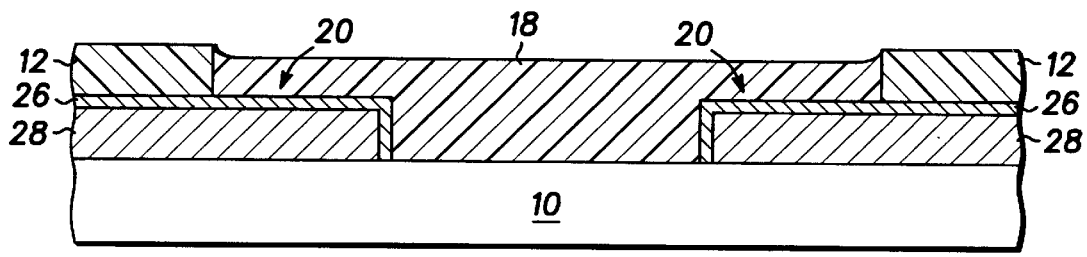

Processing steps for producing a thick-film resistor in accordance with this invention are generally represented in FIGS. 1 through 3, with terminal patterns suitable for the thick-film resistor being shown in FIG. 4 and FIG. 5. The processes described and represented in the FIG. 1 through FIG. 3 achieve the advantageous features of this invention in reference to forming thick-film resistors having precise dimensions, though it will be apparent to those skilled in the art that the invention is applicable to other thick-film circuit components, including capacitors. Furthermore, while particular resistor configurations are shown in the FIG. 4 and FIG. 5, those skilled in the art will appreciate that numerous variations and modifications are possible, and such variations and modifications are within the scope of this invention.

Referring to FIG. 1, a substrate 10 is shown on which a dielectric layer 12 has been formed. The substrate 10 can be any suitable material, including a printed wiring board, a flexible circuit, a ceramic or silicon substrate, or another dielectric layer of a multilayer circuit, though other suitable substrates and materials could also be used. As shown, a resistive ink 14 has been deposited in an opening 16 precisely formed in the dielectric layer 12, so that the width and length of a thick-film resistive mass 18 (FIG. 2 through FIG. 5) formed from the ink 14 will have the precise dimensions of the opening 16. For this purpose, the dielectric layer 12 is preferably formed of a photoimageable thick-film polymer, such that known photoimaging and development techniques can be employed to pattern the opening 16 in the dielectric layer 12. Suitable thick-film polymer compositions typically include a resin, photosensitive agents and hardeners. The resin component can be any suitable liquid resin or solid resin, so as to enable the resin mixture to be readily deposited onto the surface of the substrate 10 in liquid form, a spreadable form, or as a laminate to form the dielectric layer 12. Resins that could be used include thermoplastic resins, thermosetting resins, elastomers and mixtures thereof, which when incorporated with a photosensitive material yield a photoimageable composition. Desirable properties for the thin-film polymer include physical properties that remain stable throughout deposition and photoimaging of the dielectric layer 12. If, as in the preferred embodiment, the dielectric layer 12 is to serve as a permanent dielectric layer of the circuit structure on the substrate 10, the dielectric properties of the thin-film polymer also preferably remain stable throughout the deposition and photoimaging processes. For the above reasons, epoxies are particularly suitable as the resin for the dielectric layer 12, with preferred epoxy-base compositions being LMB 7081 and LMB 7082 commercially available from Ciba-Geigy.

In a preferred embodiment, the dielectric layer 12 is applied as one or more films to yield a precise thickness of about fifteen to about forty micrometers, although greater and lesser thicknesses are possible. Due to the presence of photosensitive agents, the opening 16 in the dielectric layer 12 can be precisely photochemically defined through a mask (not shown) and developed in the dielectric layer 12. As shown in FIG. 1, the opening 16 extends through the dielectric layer 12 to expose a portion of the substrate 10. The resistive ink 14 is then deposited in the opening 16 by screen printing, stenciling or any other technique capable of depositing a controlled amount of ink 14 in and around the opening 16. In and around the opening signifies on the edge of the opening 16 and the surface of the dielectric layer 12 immediately surrounding the opening 16, as shown in FIG. 1. Suitable ink compositions are polymer thick-film inks containing conductive particulate fillers dispersed in a polymeric matrix. A preferred ink composition known in the art contains carbon particles as the filler dispersed in a heat-curable polymer, preferably a phenolic resin. In alternate embodiments, the conductive metallic particulate filler may comprise powder.

The resistor is preferably made from a resistive ink or a resistive material with a sheet resistivity within a range extending from approximately 1 kiloohms per square to approximately 100 kiloohms per square. The applied resistive ink typically has a precured thickness ranging from approximately fifteen to approximately forty micrometers, although greater or lesser thicknesses are possible. The cured resistive material may have a resistivity which ranges from approximately 5 ohm-centimeters to approximately 100 ohm-centimeters.

A preferred technique for depositing the resistive ink 14 is to employ a screening mask (not shown) with an aperture whose lateral dimensions are larger than those of the opening 16, with the aperture being centered over the opening 16 such that the ink 14 is deposited on the entire edge of the dielectric layer 12 surrounding the opening 16, as well as in the opening 16. Preferably, as shown in FIG. 1, the resistive ink 14 is deposited in an amount sufficient to fill or nearly fill the opening 16 without overfilling the opening 16, other than the ink 14 deposited around the opening 16 on the dielectric layer 12. In so doing, heating the ink 14 to cure the polymer matrix of the resistive ink 14 yields a cured resistive mass 18 whose interior upper surface within the opening 16 is recessed below the surface of the dielectric layer 12, as seen in FIG. 2. In addition, as a result of ink 14 having been deposited on the dielectric layer 12 surrounding the opening 16, the resistive mass 18 has an excess portion 19 on the surface of the dielectric layer 12 surrounding the opening 16, as shown in FIG. 2. This excess portion 19 is subsequently removed to yield the configuration for the resistive mass 12 shown in FIG. 3.

Importantly, removal of the excess portion 19 of the resistive mass 18 following curing enables the lateral dimensions of the resistive mass 18 to be precisely determined by the length and width of the opening 16, whose precise dimensions are provided by photoimaging. The portion 19 of the cured resistive mass 18 that lies on the surface of the dielectric layer 12 can be readily removed by milling or another planarizing technique, such that the peripheral extent of the resistive mass 18 terminates at the surface of the dielectric layer 12. In contrast, the interior upper surface of the resistive mass 18 is unaltered during planarizing because the surface is recessed below the surface of the dielectric layer 12 due to shrinkage that occurred during curing, as is evident from FIG. 2 and FIG. 3. In a preferred embodiment, the excess portion 19 of the cured resistive mass 18 is removed by an abrading operation, such as grinding or polishing, which can serve to preferentially and rapidly remove the excess portion 19 lying on the surface of the dielectric layer 12. According to this invention, the abrading operation can be performed with conventional deburring, polishing or grinding equipment.

Following the abrading operation, terminals 20 can be formed to overlie the resistive mass 18, as shown in FIG. 4. A preferred process is to deposit a second photoimageable layer 22, and then pattern the photoimageable layer 22 to photolithographically form openings 24 as shown. The photoimageable layer 22 can be formed from a variety of materials, including those similar or compatible to that of the first dielectric layer 12. The photoimageable layer 22 may but is not required to serve as a permanent dielectric layer of the circuit structure. The terminals 20 can then be selectively formed through the openings 24 on the resistive mass 18, so that the terminals 20 lie above the plane of the resistive mass 18. Preferably, the terminals 20 include a nickel, gold, silver, palladium or platinum contact 26 between the resistive mass 18 and a copper interconnect 28. A suitable contact 26 is electroless nickel 26 having a thickness of about 0.1 to about 5 micrometers.

As shown in FIG. 5, an alternative termination technique within the scope of this invention is to form the terminals 20 on the surface of the substrate 10 prior to applying the dielectric layer 12 or subsequent to forming the opening 16 in the dielectric layer 12, and then form the thick-film resistive mass 18 over the terminals 20. Alternatively, wells (not shown) could be formed in the surface of the substrate 10 prior to applying the dielectric layer 12 or subsequent to forming the opening 16 in the dielectric layer 12, with the terminals 20 being deposited in the wells prior to the resistive ink 14 being deposited in the opening 16. In this manner, the terminals 20 lie outside the plane of the resistive mass 18, though below the resistive mass 18 in contrast to that shown in FIG. 4.

From the above, those skilled in the art will appreciate that, because the photolithographically-formed opening 16 precisely determines the lateral dimensions (width and length) of the resistive mass 18, the photolithographically-formed openings 24 precisely determine the electrical length of the thick-film resistor formed by the resistive mass 18, and the thickness of the resistive mass 18 can be controlled by a thick-film deposition process, the resistor has little of the dimensional variability associated with conventional screen printed thick-film resistors of the prior art. Furthermore, the resistor can be as physically small as the edge definition attainable with photodefinition techniques, enabling the precise formation of resistors having dimensions on the order of 100 micrometers.

While our invention has been described in terms of particular embodiments, it is apparent that other forms could be adopted by one skilled in the art. For example, certain processing parameters could be modified, appropriate materials could be substituted, or the process of this invention could be employed for different applications or other processes. Accordingly, the scope of our invention is to be limited only by the following claims.

What is claimed is:

1. A method for forming a thick-film resistor, the method comprising the steps of:

forming a dielectric layer on a substrate, said dielectric layer having a surface;

defining an opening in the dielectric layer;

depositing an electrically resistive material in the opening such that the electrically resistive material forms a resistive mass having a surface portion recessed below the surface of the dielectric layer and a portion that lies on the surface of the dielectric layer surrounding the opening; and removing the portion of the resistive mass that lies on the surface of the dielectric layer such that the resistive mass has lateral dimensions defined by the opening in the dielectric layer.

2. A method as recited in claim 1, wherein the dielectric layer is photoimageable.

3. A method as recited in claim 2, wherein the resistive mass is heated to cure the electrically resistive material prior to the step of removing the portion of the resistive mass that lies on the surface of the dielectric layer.

4. A method as recited in claim 1, wherein the step of removing the portion of the resistive mass that lies on the surface of the dielectric layer entails an abrading operation.

5. A method as recited in claim 1, further comprising the steps of:

forming a second dielectric layer on the dielectric layer and over the resistive mass after the step of removing the portion of the resistive mass that lies on the surface of the dielectric layer, the second dielectric layer having openings therein so as to expose at least two regions of the resistive mass; and depositing electrically-conductive material in the openings of the second dielectric layer so as to form terminals that, with the resistive mass, form the thick-film resistor.

6. A method as recited in claim 1, further comprising the step of forming electrical terminals that underlie the resistive mass.

7. A method as recited in claim 6, wherein the electrical terminals are applied to the substrate, and wherein the step of defining the opening in the surface of the dielectric layer exposes the electrical terminals.

8. A method as recited in claim 1, wherein the electrically resistive material is deposited in the opening by a screen printing operation.

9. A method for forming a thick-film resistor, the method comprising the steps of:

forming on a substrate a photoimageable dielectric layer having a thickness in a direction normal to a surface of the substrate;

photolithographically defining an opening in a surface of the photoimageable dielectric layer so as to form an edge on the photoimageable dielectric layer that surrounds the opening, the opening being characterized by a length, a width transverse to the length, and a depth equal to the thickness of the photoimageable dielectric layer;

screen printing an ink in the opening such that the ink fills the opening and overlies the edge of the photoimageable dielectric layer, the ink comprising carbon particles in a phenolic resin matrix;

heating the ink so as to form a resistive mass having a surface portion recessed below the surface of the photoimageable dielectric layer; and abrasively removing the portion of the resistive mass that overlies the edge of the photoimageable dielectric layer such that the resistive mass has a length and a width equal to the length and width, respectively, of the opening, and a thickness less than the thickness of the photoimageable dielectric layer.

10. A method as recited in claim 9, wherein the heating step serves to cure the curable matrix of the ink.

11. A method as recited in claim 9, wherein the surface portion of the resistive mass is substantially unaltered during removal of the portion of the resistive mass.

12. A method as recited in claim 9, further comprising the steps of:

forming a second photoimageable dielectric layer on the photoimageable dielectric layer and over the resistive mass, the second photoimageable dielectric layer having openings therein so as to expose at least two regions of the resistive mass; and depositing electrically conductive material in the openings in the second photoimageable dielectric layer so as to form terminals that, with the resistive mass, form a thick-film resistor.

13. A method as recited in claim 9, further comprising the step of depositing electrically conductive material on the substrate so as to form electrical terminals that underlie the resistive mass and, with the resistive mass, form a thick-film resistor.

* * * * *